(12) United States Patent
Knowles

(10) Patent No.: US 6,744,636 B2
(45) Date of Patent: Jun. 1, 2004

(54) HIGH-G MOUNTING ARRANGEMENT FOR ELECTRONIC CHIP CARRIER

(75) Inventor: Gary R. Knowles, Ham Lake, MN (US)

(73) Assignee: Honeywell International, Inc., Morristown, NJ (US)

(*) Notice: Subject to any disclaimer, the term of this patent is extended or adjusted under 35 U.S.C. 154(b) by 0 days.

(21) Appl. No.: 10/261,015

(22) Filed: Sep. 30, 2002

(65) Prior Publication Data

US 2003/0053301 A1 Mar. 20, 2003

Related U.S. Application Data

(63) Continuation of application No. 09/760,928, filed on Jan. 16, 2001, now abandoned.

(51) Int. Cl.[7] .................................................. H05K 7/12
(52) U.S. Cl. ...................... 361/767; 361/768; 361/792; 361/793; 257/777; 257/778; 257/779
(58) Field of Search ................................ 361/767, 760, 361/764, 768, 772, 792, 808, 777; 257/669, 737, 719, 777, 778, 779

(56) References Cited

U.S. PATENT DOCUMENTS

| 4,554,575 A | 11/1985 | Lucas |
| 4,595,794 A | 6/1986 | Wasserman |
| 4,750,089 A | 6/1988 | Derryberry et al. |
| 4,959,900 A | 10/1990 | de Givry et al. |
| 5,410,451 A | 4/1995 | Hawthorne et al. |

FOREIGN PATENT DOCUMENTS

DE 35 36 431 A1 4/1987

OTHER PUBLICATIONS

International Seach Report.
Patent Abstract of Japan, Publication No. 06252520, Publication Date Sep. 9, 1994.
Patent Abstract of Japan, Publication No. 10117054, Publication Date Jun. 5, 1998.

Primary Examiner—David Martin
Assistant Examiner—Hung Bui
(74) Attorney, Agent, or Firm—Schiff Hardin LLP

(57) ABSTRACT

A chip carrier is coupled to a printed circuit board by leads so that the chip carrier stands off from the printed circuit board. A spacer is provided between the chip carrier and the printed circuit board. The spacer reduces g forces on the leads.

28 Claims, 2 Drawing Sheets

HIGH-G MOUNTING ARRANGEMENT FOR ELECTRONIC CHIP CARRIER

RELATED APPLICATION

The present application is a continuation of application Ser. No. 09/760,928 filed on Jan. 16, 2001 now abandoned.

TECHNICAL FIELD OF THE INVENTION

The present invention relates to a mounting arrangement for an electronic chip carrier.

BACKGROUND OF THE INVENTION AND PRIOR ART

Chip carriers, such as ceramic chip carriers, are used to enclose sensitive electronic devices that must function in difficult environments such as vacuums. Some applications, such as gun-launched electronics, subject the chip carrier to substantial acceleration forces (g's) of more than 7000 g's.

A standard mounting arrangement for mounting a chip carrier 10 to a printed circuit board 12 is shown in FIG. 1. The chip carrier 10, which may be a ceramic chip carrier, is mounted to the printed circuit board 12 by a plurality of J leads 14. The J leads 14 may be copper or a copper alloy and are suitably coupled such as by braising or soldering to the electronics contained within the chip carrier 10. The J leads 14 are also coupled such as by soldering to appropriate elements of the printed circuit board 12.

As can be seen from FIG. 1, the chip carrier 10 is supported above the printed-circuit board 12 by the J leads 14. This mounting arrangement shown in FIG. 1 accommodates mismatches in coefficients of thermal expansion between the chip carrier 10 and the printed circuit board 12. However, the J leads 14 for the chip carrier 10 will not adequately support the chip carrier 10 when subjected to the very high accelerations of some applications such as gun-launch applications.

For example, the chip carrier 10 may weigh as little as one gram. However, at an acceleration of 10,000 times gravity (10,000 g's), the chip carrier 10 effectively weighs ten kilograms (or twenty-two pounds). That acceleration force can occur in a normal direction, in a shear direction, or in any combination of normal and shear directions relative to the printed circuit board 12. At one gram, the chip carrier 10 may have as many as twenty of the J leads 14 each of which is 0.008 by 0.025 inches in cross-section. At 10,000 g's, this arrangement results in 5,500 pounds per square inch in shear on the J leads 14, causing the J leads 14 to fail and allow separation between the chip carrier 10 and the printed circuit board 12.

The present invention is directed to an arrangement which overcomes one or more of these or other problems of the prior art.

SUMMARY OF THE INVENTION

In accordance with one aspect of the present invention, a mounting arrangement comprises a chip carrier, a mounting structure, and a spacer. The spacer is between the chip carrier and the mounting structure, and the spacer has dimensions so as to transfer g forces from the chip carrier to the mounting structure.

In accordance with another aspect of the present invention, a mounting arrangement comprises a chip carrier, a mounting structure, leads, and a spacer.

The leads couple the chip carrier to the mounting structure so that the chip carrier stands off from the mounting structure. The spacer is between the chip carrier and the mounting structure, and the spacer is reduces g forces on the leads.

In accordance with still another aspect of the present invention, a method of mounting a chip carrier to a mounting structure comprises bonding a spacer to the chip carrier, and bonding the spacer to the mounting structure. The spacer is arranged to transfer g forces from the chip carrier to the mounting structure.

In accordance with a further aspect of the present invention, an assembly comprises a chip carrier, a mounting structure, leads, and a force diverter. The leads are electrically coupled to the chip carrier and to the mounting structure. The force diverter is mechanically coupled to the chip carrier and to the mounting structure, and the force diverter is arranged to divert force generated by the chip carrier from the leads and to the mounting structure.

BRIEF DESCRIPTION OF THE DRAWINGS

These and other features and advantages will become more apparent from a detailed consideration of the invention when taken in conjunction with the drawings in which.

DETAILED DESCRIPTION

Figure 2:
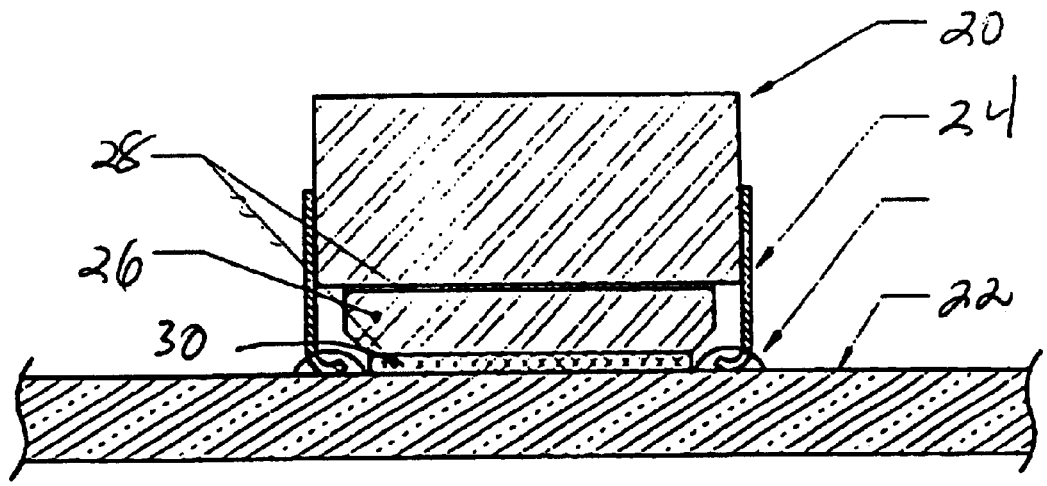
FIG. 2 is a cross-sectional side view of a mounting arrangement for mounting a chip carrier to a mounting support, such as a printed circuit board, according to an embodiment of the present invention; and, FIG. 3 is a reproduction of FIG. 2 showing dimensions useful in presenting an example of the present invention.

As shown in FIG. 2, a chip carrier 20 is mounted to a printed circuit board 22 by a plurality of J leads 24. The chip carrier 20, for example, may be ceramic such as an alumina mixture having a coefficient of thermal expansion on the order of $6 \times 10^{-6}$ in/in-degree-C. The J leads 24, for example, may be copper or a copper alloy having a coefficient of thermal expansion on the order of $18 \times 10^{-6}$ in/in-degree-C. The J leads 24 are suitably coupled to the electronics contained within the chip carrier 20. For example, the J leads 24 may be braised or soldered to contacts extending into the chip carrier 20. The J leads 24 are also electrically coupled such as by soldering to appropriate elements of the printed circuit board 22.

Figure 1:
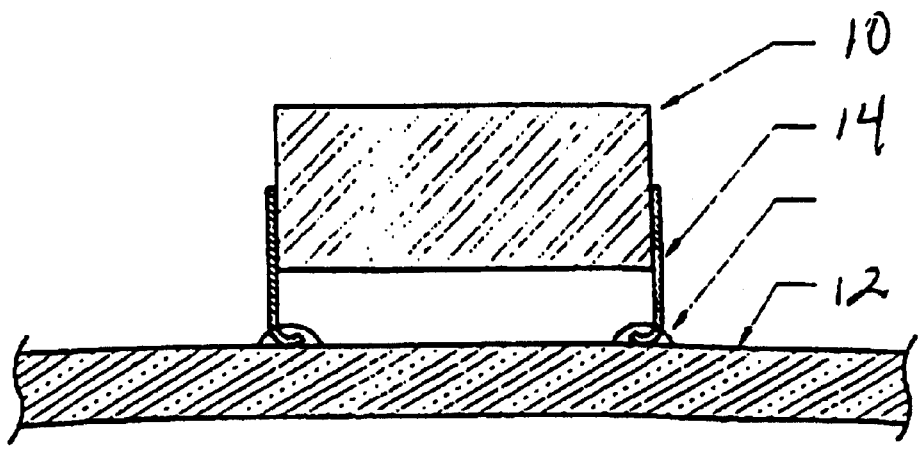
FIG. 1 is a cross-sectional side view of a prior art mounting arrangement for mounting a chip carrier to a printed circuit board.

Unlike the prior mounting arrangement shown in FIG. 1, the chip carrier 20 is not solely supported above the printed circuit board 22 by the J leads 24. Instead, a spacer 26 is provided between the chip carrier 20 and the printed circuit board 22. The spacer 26 may be held in place by a first adhesive layer 28 bonding the spacer 26 to the chip carrier 20 and a second adhesive layer 30 bonding the spacer 26 to the printed circuit board 22. The adhesive of the first and second adhesive layers 28 and 30, for example, may be epoxy having a coefficient of thermal expansion on the order of $50 \times 10^{-6}$ in/in-degree-C. Accordingly, the spacer 26 diverts at least enough of the forces exerted on the chip carrier 20 during accelerations in order to protect the J leads 24 coupled between the chip carrier 20 and the printed circuit board 22. That is, the spacer 26 reduces the per square inch force exerted on the J leads 24.

The mounting arrangement shown in FIG. 2 preferably matches the coefficients of thermal expansion of the materials that are used for the chip carrier 20, the J leads 24, and the spacer 26, and the first and second adhesive layers 28 and 30. For given of materials for the chip carrier 20 and the J leads 24, the materials for the spacer 26 and for the first and second adhesive layers 28 and 30 are selected in order to provide a match for these coefficients of thermal expansion. For example, if ceramic is used for the chip carrier 20 and copper or a copper alloy is used for the J leads 24, then ceramic may be chosen for the spacer 26 and epoxy may be chosen for the adhesive in the first and second adhesive layers 28 and 30. In this case, the coefficient of thermal expansion of ceramic is less that the coefficient of thermal expansion of copper which is less than the coefficient of thermal expansion of epoxy.

Assuming that the materials as described immediately above are used, the relative thicknesses of the spacer 26 and of the first and second adhesive layers 28 and 30 may be calculated using a three dimensional finite element analysis of the expansion properties due to the varying vertical and horizontal expansion coefficients of the epoxy when constrained by the lower coefficients of thermal expansion of the ceramic and of the material of the printed circuit board 22. There will always be a solution to this analysis because the coefficient of thermal expansion of ceramic is less that the coefficient of thermal expansion of copper which is less than the coefficient of thermal expansion of epoxy.

Figure 3:
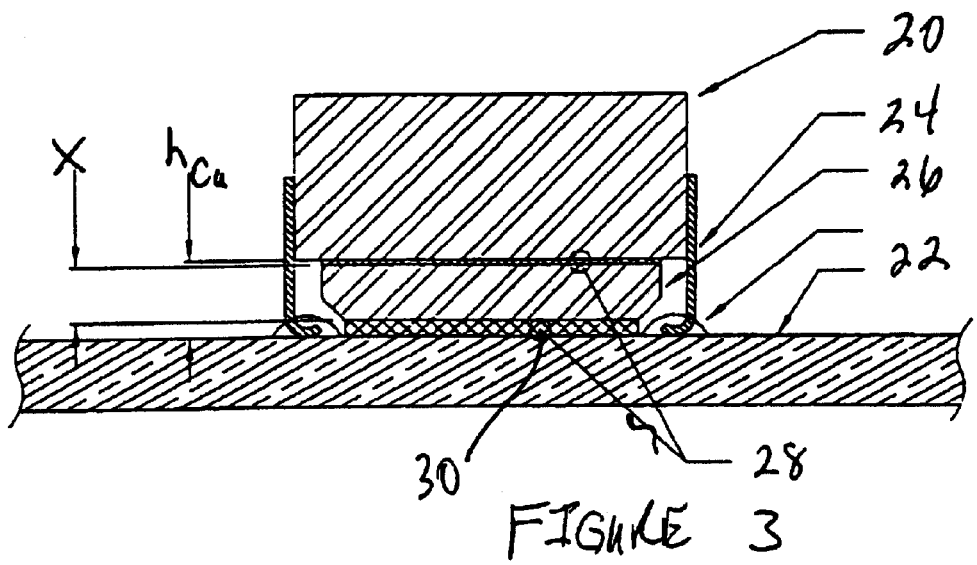

A simplified form of the equations which must be solved using a finite element analysis are given as follows:

$$(h_{Cu})(CT_{Cu}) = (h_{ceramic})(CTE_{ceramic}) + (h_{epoxy})(CTE_{epoxy}) \quad (1)$$

$$(h_{Cu}) = (h_{ceramic}) + (h_{epoxy}) \quad (2)$$

where h is a dimension of the material, where CTE is coefficient of thermal expansion, and where Cu is copper. Accordingly, $h_{epoxy}$ in equations (1) and (2) is the combined thickness of the first and second adhesive layers 28 and 30, $h_{ceramic}$ is the thickness of the spacer 26, and $h_{Cu}$ is the length of the J leads 24 between the lower edge of the chip carrier 20, as viewed in FIG. 2, and the upper surface of the printed circuit board 22. Exemplary dimensions are shown in FIG. 3. Therefore, given the materials for the first and second adhesive layers 28 and 30, the spacer 26, and the J leads 24, the three dimensional finite element analysis represented by equations (1) and (2) determines the dimensions of these devices.

For example, let it be assumed that the length of the J-leads 24 between the lower edge of the spacer 26 and the upper surface of the printed circuit board 22 is 0.070 inches, and let it be assumed that X is the as yet unknown thickness of the spacer 26 required to equalize the thermal expansion of the J leads 24 and the supporting spacer 26. Accordingly, $h_{Cu}$ is 0.070 inches, $h_{spacer}$ is X, and $h_{epoxy}$ is (0.070−X) inches. Inserting these thicknesses and the CTE's of copper, ceramic, and epoxy into equation (1) produces that following equation:

$$(0.07)(18 \times 10^{-6}) = (X)(6 \times 10^{-6}) + (0.070 - X)(50 \times 10^{-6})$$

Solving for X produces X=0.050909, or approximately 0.051. Therefore, the total epoxy thickness must be (0.070−0.051) inches or 0.019 inches.

The above example depends upon the use of ceramic for the spacer 26, epoxy for the first and second adhesive layers 28 and 30, and copper for the J leads 24. However, it is possible to use different materials for any or all of the J leads 24, the spacer 26, and the first and/or second adhesive layers 28 and 30. For example, the J leads 24 may be copper, the first and/or second adhesive layers 28 and 30 may be epoxy, but the spacer 26 may be a material other than ceramic so long as the CTE for the material selected for the spacer 26 satisfies the three dimensional finite element analysis and results in a reasonable thickness for the spacer 26.

Now, if the chip carrier 20 weighs one gram, and if the spacer 26 provides a support surface for the chip carrier 20 that is 0.09 square inches, a vertical acceleration of 10,000 times gravity results in the chip carrier 20 having an effective weight of ten kilograms (or twenty-two pounds) producing a stress of 170 pounds per square inch on the first and second adhesive layers 28 and 30. This stress is far less than the 6,000 pounds per square inch force produced by the arrangement shown in FIG. 1 and, if epoxy is used as the material for the first and second adhesive layers 28 and 30, is also well below the several thousand pound per square inch limit for epoxy.

Moreover, by making the first adhesive layer 28 the thinnest practical epoxy layer, the spacer 26 strengthens and stiffens the bottom of the chip carrier 20, and the resulting greater thickness of the second adhesive layer 30 better accommodates lateral expansion differences between the spacer 26 and the printed circuit board 22.

The use of the spacer 26 and the first and second adhesive layers 28 and 30 permits a combination of high and low thermal expansion materials having thicknesses selected so that their combined thermal expansion approximates the thermal expansion coefficient of the J leads 24. Accordingly, bending of the J leads 24 and thermal stressing on the solder joints of the J leads 24 are thereby minimized. Further, the spacer 26 provides structural support to accommodate the high mechanical loads resulting from high accelerations on the chip carrier 20. Accordingly, failure of the J leads 24 during high g shocks is thereby avoided.

Certain modifications of the present invention have been discussed above. Other modifications will occur to those practicing in the art of the present invention. For example, as described above, the chip carrier 20 is mounted to the printed circuit board 22. However, the chip carrier 20 may be mounted to support structures other than the printed circuit board 22.

Also as described above, ceramic is chosen for the spacer 26 and epoxy is chosen for the adhesive in the first and second adhesive layers 28 and 30 for the case where ceramic is used for the chip carrier 20 and copper or a copper alloy is used for the J leads 24. However, materials other than ceramic can be chosen for the spacer 26 and materials other than epoxy can be chosen for the adhesive in the first and second adhesive layers 28 and 30 if a material other than ceramic is used for the chip carrier 20 and/or if a material other than copper is used for the J leads 24. Moreover, even where ceramic is used for the chip carrier 20 and copper or a copper alloy is used for the J leads 24, a material other than ceramic can be chosen for the spacer 26 and a material other than epoxy can be chosen for the adhesive in the first and second adhesive layers 28 and 30.

Furthermore, the chip carrier 20 is coupled to the printed circuit board 22 by the J leads 24. However, leads other than J leads can be used to couple the chip carrier 20 to the printed circuit board 22.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A mounting arrangement comprising:
   a chip carrier;
   a mounting structure coupled to the chip carrier by electrically conductive leads;
   a spacer engaging both the chip carrier and the mounting structure so as to transfer g forces from the chip carrier to the mounting structure through the spacer to thereby prevent damage to the electrically conductive leads from excessive g forces;
   a first adhesive layer that bonds the spacer block to the chip carrier; and,
   a second adhesive layer that bonds the spacer block to the mounting structure, wherein the first adhesive layer is thinner than the second adhesive layer.

2. The mounting arrangement of claim 1 wherein the spacer includes a spacer block wherein a coefficient of thermal expansion of the spacer block is less than a coefficient of thermal expansion of the leads which is less than a coefficient of thermal expansion of the first and second adhesives.

3. The mounting arrangement of claim 2 wherein the chip carrier and the spacer block are both ceramic.

4. The mounting arrangement of claim 2 wherein the chip carrier and the spacer are both ceramic, and wherein the first and second adhesive layers are epoxy.

5. The mounting arrangement of claim 1 wherein the spacer comprises ceramic.

6. The mounting arrangement of claim 1 wherein the mounting structure comprises a printed circuit board.

7. The mounting arrangement of claim 1 wherein the chin carrier comprises a top, a bottom, and a side extending between the top and the bottom, wherein the spacer engages both the bottom of the chip carrier and the mounting structure, and wherein the leads extend along the side of the chip carrier, past the bottom of the chip carrier, and to the mounting structure.

8. The mounting arrangement of claim 7 wherein the spacer is between the chip carrier and the mounting structure.

9. The mounting arrangement of claim 8 wherein the electrically conductive leads comprise J leads.

10. The mounting arrangement of claim 1 wherein the electrically conductive leads comprise J leads.

11. A mounting arrangement comprising:
    a chip carrier;
    a mounting structure;
    leads that electrically couple the chip carrier to the mounting structure so that the chip carrier stands off from the mounting structure; and,
    a spacer between the chip carrier and the mounting structure, wherein the spacer physically engages both the chip carrier and the mounting structure so as to transfer g forces from the chip carrier to the mounting structure through the spacer whereby the spacer reduces g forces on the leads to thereby prevent damage to the electrically conductive leads from excessive g forces,
    wherein the spacer comprises a spacer block and first and second adhesive layers, wherein the first adhesive layer bonds the spacer block to the chip carrier, and wherein the second adhesive layer bonds the spacer block to the mounting structure, and wherein the first adhesive layer is thinner than the second adhesive layer, and wherein the spacer is selected so that there is a substantial match of thermal expansions of the spacer, the leads, the chip carrier, and the first and second adhesive layers.

12. The mounting arrangement of claim 11 wherein the chip carrier and the spacer comprise corresponding ceramic structures.

13. The mounting arrangement of claim 11 wherein the spacer block has a first coefficient of thermal expansion $CTE_1$, wherein the leads have a second coefficient of thermal expansion $CTE_2$, wherein the first and second adhesive layers have a third coefficient of thermal expansion $CTE_3$, and wherein $CTE_1 < CTE_2 < CTE_3$.

14. The mounting arrangement of claim 13 wherein the chip carrier and the spacer block are both ceramic.

15. The mounting arrangement of claim 13 wherein the first and second adhesive layers are epoxy.

16. The mounting arrangement of claim 15 wherein the chip carrier and the spacer block are both ceramic.

17. The mounting arrangement of claim 11 wherein the mounting structure is a printed circuit board.

18. The mounting arrangement of claim 11 wherein the chip carrier comprises a top, a bottom, and a side extending between the top and the bottom, wherein the spacer engages both the bottom of the chip carrier and the mounting structure, and wherein the leads extend along the side of the chip carrier, past the bottom of the chip carrier, and to the mounting structure.

19. The mounting arrangement of claim 8 wherein the leads comprise J leads.

20. The mounting arrangement of claim 11 wherein the leads comprise J leads.

21. A method of mounting a chip carrier to a mounting structure so that the chip carrier stands off of the mounting structure by electrical J leads extending directly between the chip carrier and the mounting structure, the electrical J leads having a straight portion contacting the chip carrier and a bent portion contacting the mounting structure, the method comprising:
    bonding a spacer to the chip carrier; and,
    bonding the spacer to the mounting structure, wherein the spacer comprises a material and dimensions with respect to the electrical J leads so as to prevent g force damage to the electrical J leads.

22. The method of claim 21 wherein the chip carrier and the spacer are both ceramic.

23. The method of claim 21 wherein the bonding of the spacer to the chip carrier comprises bonding the spacer to the chip carrier using a first adhesive layer, wherein the bonding of the spacer to the mounting structure comprises bonding the spacer to the mounting structure using a second adhesive layer, and
    wherein the first adhesive layer is thinner than the second adhesive layer.

24. The method of claim 21 wherein the bonding of the spacer to the chip carrier comprises bonding the spacer to the chip carrier using a first adhesive layer, wherein the bonding of the spacer to the mounting structure comprises bonding the spacer to the mounting structure using a second adhesive layer, and wherein the spacer and the first and second adhesive layers are selected so that thermal expansions of the spacer and the first and second adhesive layers substantially match thermal expansion of the electrical J leads.

25. The method of claim 24 wherein the spacer has a first coefficient of thermal expansion $CTE_1$, wherein the electrical J leads have a second coefficient of thermal expansion $CTE_2$, wherein the first and second adhesive layers have a third coefficient of thermal expansion $CTE_3$, and wherein $CTE_1 < CTE_2 < CTE_3$.

26. The method of claim 25 wherein the first and second adhesive layers are epoxy.

27. The method of claim 21, wherein the mounting structure is a printed circuit board.

28. A mounting arrangement comprising:
- a chip carrier;
- a mounting structure coupled to the chip carrier by electrically conductive leads;
- a spacer engaging both the chip carrier and the mounting structure so as to transfer g forces from the chip carrier to the mounting structure through the spacer to thereby prevent damage to the electrically conductive leads from excessive g forces;
- an adhesive that bonds the spacer block to the chip carrier and to the mounting structure, wherein the spacer has a first coefficient of thermal expansion $CTE_1$, wherein the electrically conductive leads have a second coefficient of thermal expansion $CTE_2$, wherein the adhesive has a third coefficient of thermal expansion $CTE_3$, and wherein $CTE_1 < CTE_2 < CTE_3$.

* * * * *

UNITED STATES PATENT AND TRADEMARK OFFICE
CERTIFICATE OF CORRECTION

PATENT NO. : 6,744,636 B2
DATED : June 1, 2004
INVENTOR(S) : Gary R. Knowles

It is certified that error appears in the above-identified patent and that said Letters Patent is hereby corrected as shown below:

Column 1,
Line 30, change "printed-circuit" to -- printed circuit --.

Column 3,
Line 1, after "given", delete "of".
Line 28, in equation (1), change "$(CT_{Cu})$" to -- $(CTE_{Cu})$ --.

Column 5,
Line 26, after "spacer", insert "block".
Line 32, change "chin", to -- chip --.

Signed and Sealed this

Twelfth Day of April, 2005

JON W. DUDAS
*Director of the United States Patent and Trademark Office*